United States Patent
Emura et al.

(10) Patent No.: US 10,164,153 B2
(45) Date of Patent: Dec. 25, 2018

(54) LIGHT-EMITTING ELEMENT

(71) Applicant: NICHIA CORPORATION, Anan-shi, Tokushima (JP)

(72) Inventors: Keiji Emura, Anan (JP); Takamasa Sunda, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/853,567

(22) Filed: Dec. 22, 2017

(65) Prior Publication Data

US 2018/0182922 A1 Jun. 28, 2018

(30) Foreign Application Priority Data

Dec. 26, 2016 (JP) .................................. 2016-252018

(51) Int. Cl.
| | | |
|---|---|---|
| H01L 33/40 | (2010.01) | |
| H01L 33/38 | (2010.01) | |
| H01L 33/48 | (2010.01) | |
| H01L 33/36 | (2010.01) | |

(52) U.S. Cl.
CPC .............. *H01L 33/38* (2013.01); *H01L 33/36* (2013.01); *H01L 33/382* (2013.01); *H01L 33/387* (2013.01); *H01L 33/405* (2013.01); *H01L 33/483* (2013.01)

(58) Field of Classification Search
CPC ......... H01L 3/38; H01L 33/382; H01L 33/36; H01L 33/405; H01L 33/483
See application file for complete search history.

(56) References Cited

U.S. PATENT DOCUMENTS

| | | | |
|---|---|---|---|
| 2010/0117111 A1 | 5/2010 | Illek et al. | |
| 2011/0068359 A1 | 3/2011 | Yahata et al. | |
| 2014/0124821 A1 | 5/2014 | Tomonari et al. | |
| 2014/0225143 A1* | 8/2014 | Kususe | H01L 33/62 257/98 |
| 2014/0339587 A1 | 11/2014 | Kawaguchi et al. | |
| 2014/0353708 A1* | 12/2014 | Seo | H01L 27/153 257/98 |
| 2016/0043290 A1 | 2/2016 | Sogo et al. | |
| 2016/0111614 A1 | 4/2016 | Lee et al. | |

FOREIGN PATENT DOCUMENTS

| | | |
|---|---|---|
| JP | 2004-177612 A | 6/2004 |
| JP | 2010-525586 A | 7/2010 |
| JP | 2011-066304 A | 3/2011 |
| JP | 2014-093480 A | 5/2014 |
| JP | 2014-241401 A | 12/2014 |
| JP | 2016-039324 A | 3/2016 |
| JP | 2016-082231 A | 5/2016 |
| WO | WO-2008/131736 A1 | 11/2008 |

* cited by examiner

*Primary Examiner* — Peter Bradford
(74) *Attorney, Agent, or Firm* — Foley & Lardner LLP

(57) ABSTRACT

A light-emitting element includes: a semiconductor structure; light-reflecting electrodes; a first insulating film having: one or more first n-side openings and one or more first p-side openings; one or more interconnect electrodes on an upper surface of the first insulating film; a first electrode on the upper surface of the first insulating film; a second electrode on the upper surface of the first insulating film; a second insulating film having: one or more second n-side openings and one or more second p-side openings; a first external connection portion; and a second external connection portion.

16 Claims, 9 Drawing Sheets

LIGHT-EMITTING ELEMENT

CROSS-REFERENCE TO RELATED APPLICATION

This application claims priority to Japanese Patent Application No. 2016-252018, filed on Dec. 26, 2016, the disclosure of which is hereby incorporated by reference in its entirety.

BACKGROUND

The present disclosure relates to a light-emitting element.

Japanese Laid-Open Patent Publication No. 2010-525586 describes a light-emitting element including: a semiconductor body including a region having n-type conductivity and a region having p-type conductivity which is disposed on a portion of the region having n-type conductivity excluding a predetermined region; a first insulation layer disposed on the semiconductor structure and having a plurality of openings therein; a second contact connected to the region having n-type conductivity through some of the plurality of openings; a first contact connected to the region having p-type conductivity through other ones of the plurality of openings; a first connection layer connected to the first contact; and a second connection layer connected to the second contact. In this light-emitting element, the first connection layer and the second connection layer are formed to cover a predetermined portion of the region having n-type conductivity exposed from the region having p-type conductivity in a plan view (i.e., when viewed from a side on which contacts are formed).

SUMMARY

In the case in which the light-emitting element described above is bonded to a mounting substrate or the like, the thermal stress generated during the bonding is concentrated to a region of the semiconductor body where a portion of the region having n-type conductivity is exposed by removing a portion of the region having p-type conductivity and in a vicinity thereof. Thus, an insulating film (e.g., the first insulation layer) and an electrode (e.g., the second contact) formed in the exposed portion of the region having n-type conductivity may be detached from the semiconductor body.

A light-emitting element according to one embodiment includes: an insulating substrate; a plurality of semiconductor structures, each of which includes: an n-type semiconductor layer disposed on an upper surface of the substrate, an active layer disposed in a region of an upper surface of the n-type semiconductor layer other than one or more predetermined regions thereof, and a p-type semiconductor layer disposed on an upper surface of the active layer; light-reflecting electrodes, each of which is disposed on an upper surface of the p-type semiconductor layer of a respective one of the plurality of semiconductor structures; a first insulating film made of an inorganic material and covering the plurality of semiconductor structures, the first insulating film having: one or more first n-side openings, each of which is located above a respective one of the one or more predetermined regions of the upper surface of the n-type semiconductor layer of a respective one of the plurality of semiconductor structures, and one or more first p-side openings, each of which is located above a respective one of the light-reflecting electrodes; one or more interconnect electrodes disposed on an upper surface of the first insulating film, each of the one or more interconnect electrodes connected to the n-type semiconductor layer of one of corresponding two adjacent ones of the plurality of semiconductor structures through a respective one of the one or more first n-side openings, and connected to a respective one of the light-reflecting electrodes of the other of the corresponding two adjacent ones of the semiconductor structures through a respective one of the one or more first p-side openings; a first electrode disposed on the upper surface of the first insulating film and connected, through a respective one of the one or more first n-side openings, to the n-type semiconductor layer of one of the plurality of semiconductor structures on which a respective one of the light-reflecting electrodes is connected to a respective one of the interconnect electrodes; a second electrode disposed on the upper surface of the first insulating film and connected, through a respective one of the one or more first p-side openings, to the light-reflecting electrode of one of the plurality of semiconductor structures in which the n-type semiconductor layer is connected to a respective one of the interconnect electrodes; a second insulating film made of an inorganic material, the second insulating film having: one or more second n-side openings located above the first electrode, and one or more second p-side openings located above the second electrode; a first external connection portion disposed on an upper surface of the second insulating film in a region other than the one or more predetermined regions of each of the semiconductor structures in a top view, and connected to the first electrode through each of the one or more second n-side openings; and a second external connection portion disposed on the upper surface of the second insulating film in a region other than the one or more predetermined regions of each of the semiconductor structures in a top view, and connected to the second electrode through each of the one or more second p-side openings.

A light-emitting element according to another embodiment of the present disclosure includes: an insulating substrate; a semiconductor structure including: an n-type semiconductor layer disposed on an upper surface of the substrate, an active layer disposed in a region of an upper surface of the n-type semiconductor layer other than one or more predetermined regions thereof, and a p-type semiconductor layer disposed on an upper surface of the active layer; a light-reflecting electrode disposed on an upper surface of the p-type semiconductor layer of the semiconductor structure; a first insulating film made of an inorganic material and covering the plurality of semiconductor structures, the first insulating film having: one or more first n-side openings, each of which is located above a respective one of the one or more predetermined regions of the upper surface of the n-type semiconductor layer of the semiconductor structure, and one or more first p-side openings, each of which is located above the light-reflecting electrode; a first electrode disposed on the upper surface of the first insulating film and connected, through a respective one of the one or more first n-side opening, to the n-type semiconductor layer of the semiconductor structure; a second electrode disposed on the upper surface of the first insulating film and connected, through a respective one of the one or more first p-side openings, to the light-reflecting electrode; a second insulating film made of an inorganic material, the second insulating film having: one or more second n-side openings located above the first electrode, and one or more second p-side openings located above the second electrode; a first external connection portion disposed on an upper surface of the second insulating film in a region other than the one or more predetermined regions of the semiconductor structure in a top view, and connected to the first electrode through each of the one or more second n-side openings; and a second external connection portion disposed on the upper surface of the second insulating film in a region other than the one or more predetermined regions of the semiconductor structure in a top view, and connected to the second electrode through each of the one or more second p-side openings.

With such configurations as described above, thermal stress generated at an exposed portion of the n-type semiconductor layer and in the vicinity thereof can be reduced. Thus, detachment of an electrode and/or an insulating film formed in the region where the n-type semiconductor layer is exposed from the p-type semiconductor layer can be reduced, so that a light-emitting element having a high reliability can be provided.

DETAILED DESCRIPTION

Embodiment 1

Figure 1:
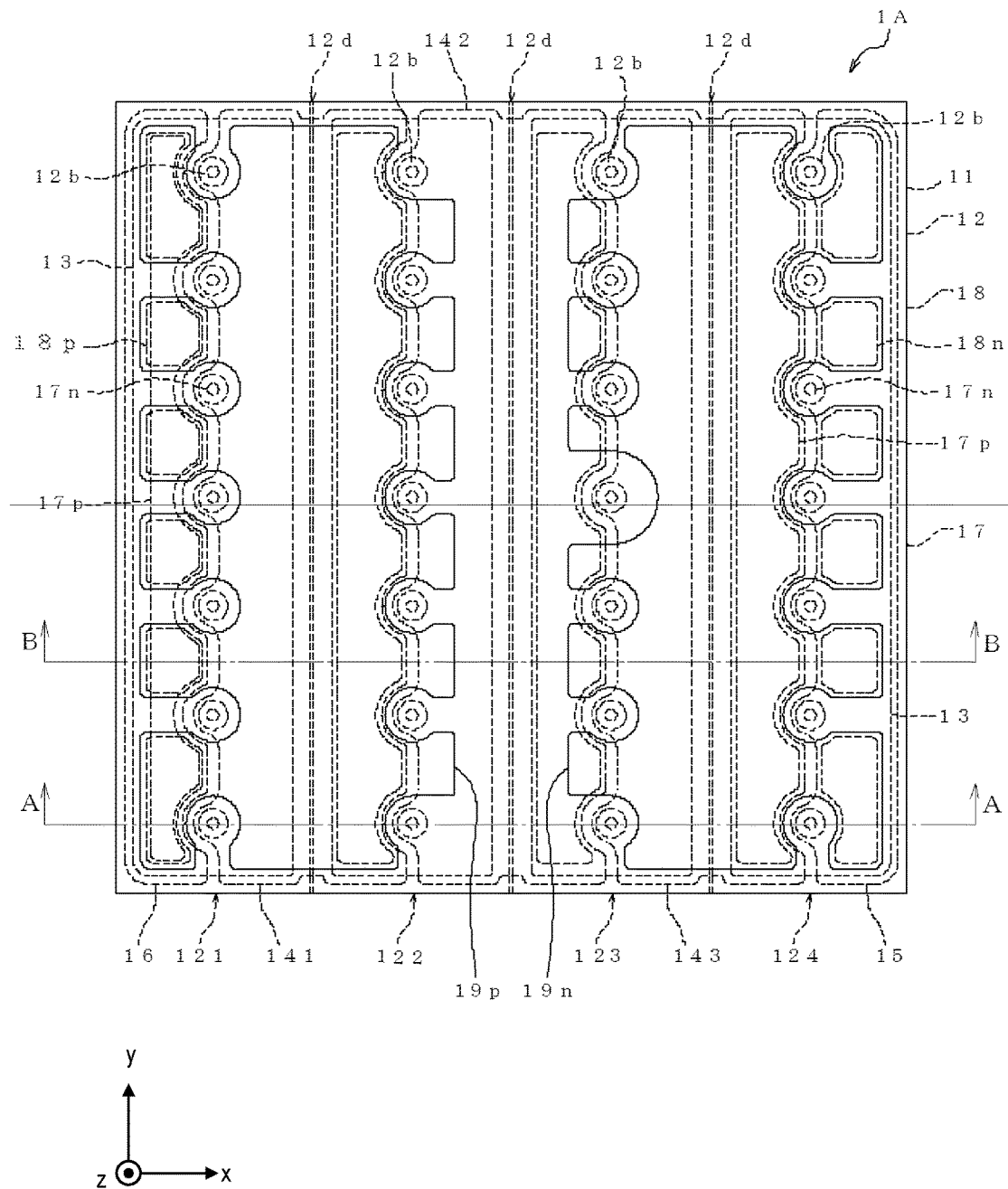
FIG. 1 is a plan view schematically showing a configuration of a light-emitting element according to Embodiment 1.
Figure 2:
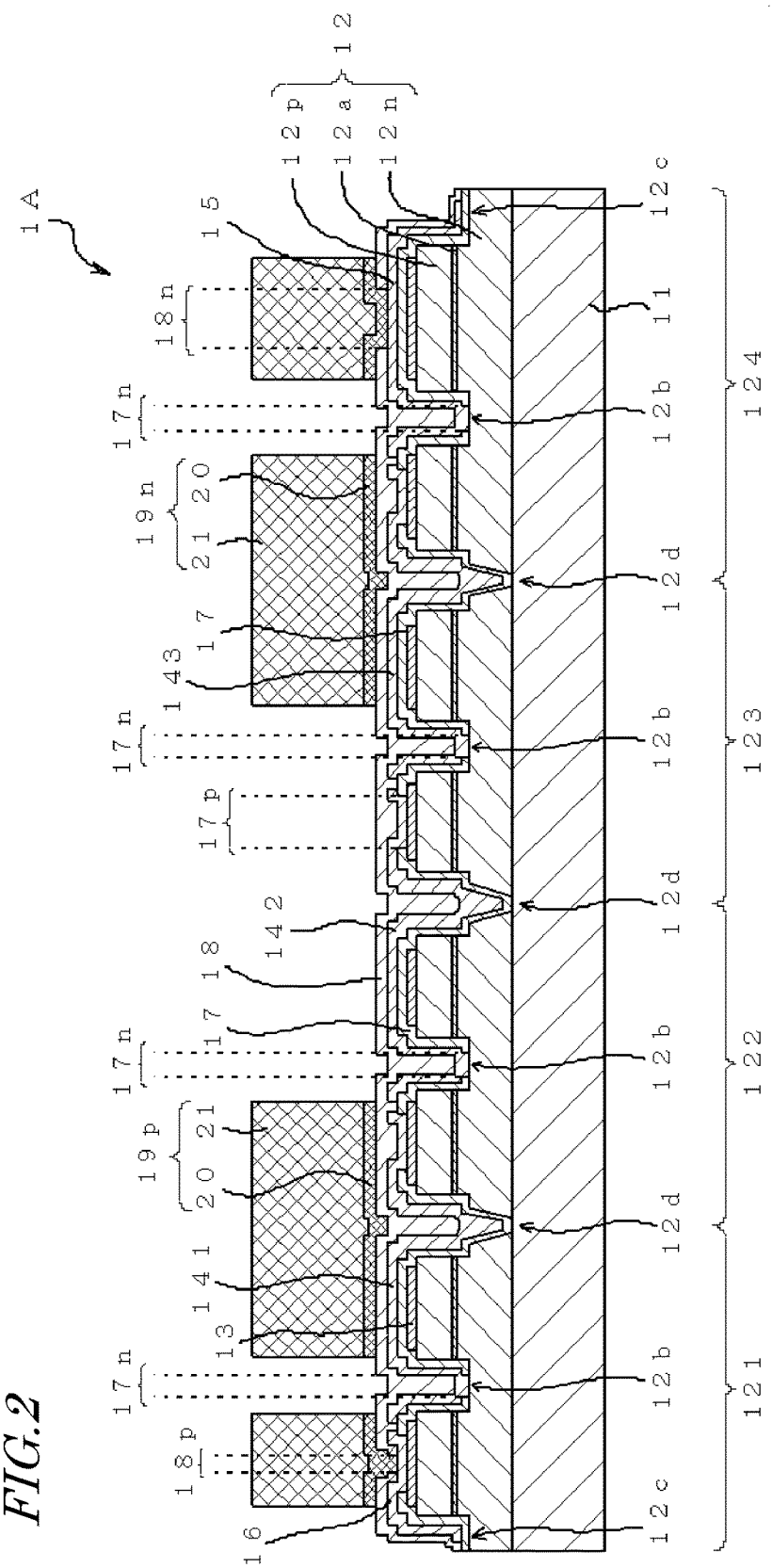
FIG. 2 is a cross-sectional view schematically showing the configuration of the light-emitting element according to Embodiment 1 taken along a line A-A of FIG. 1.
Figure 3:
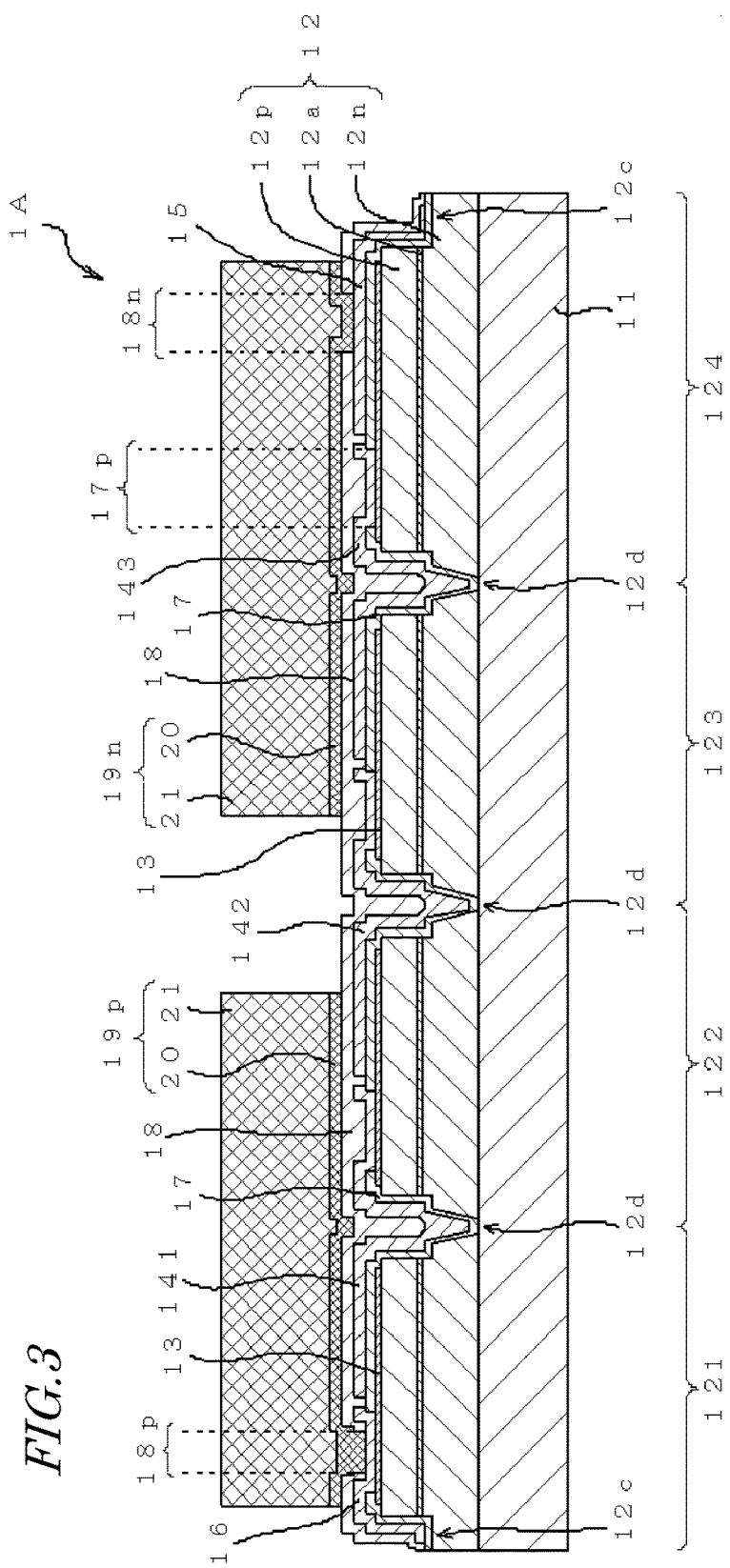
FIG. 3 is a cross-sectional view schematically showing the configuration of the light-emitting element according to Embodiment 1 taken along a line B-B of FIG. 1.
Figure 4:
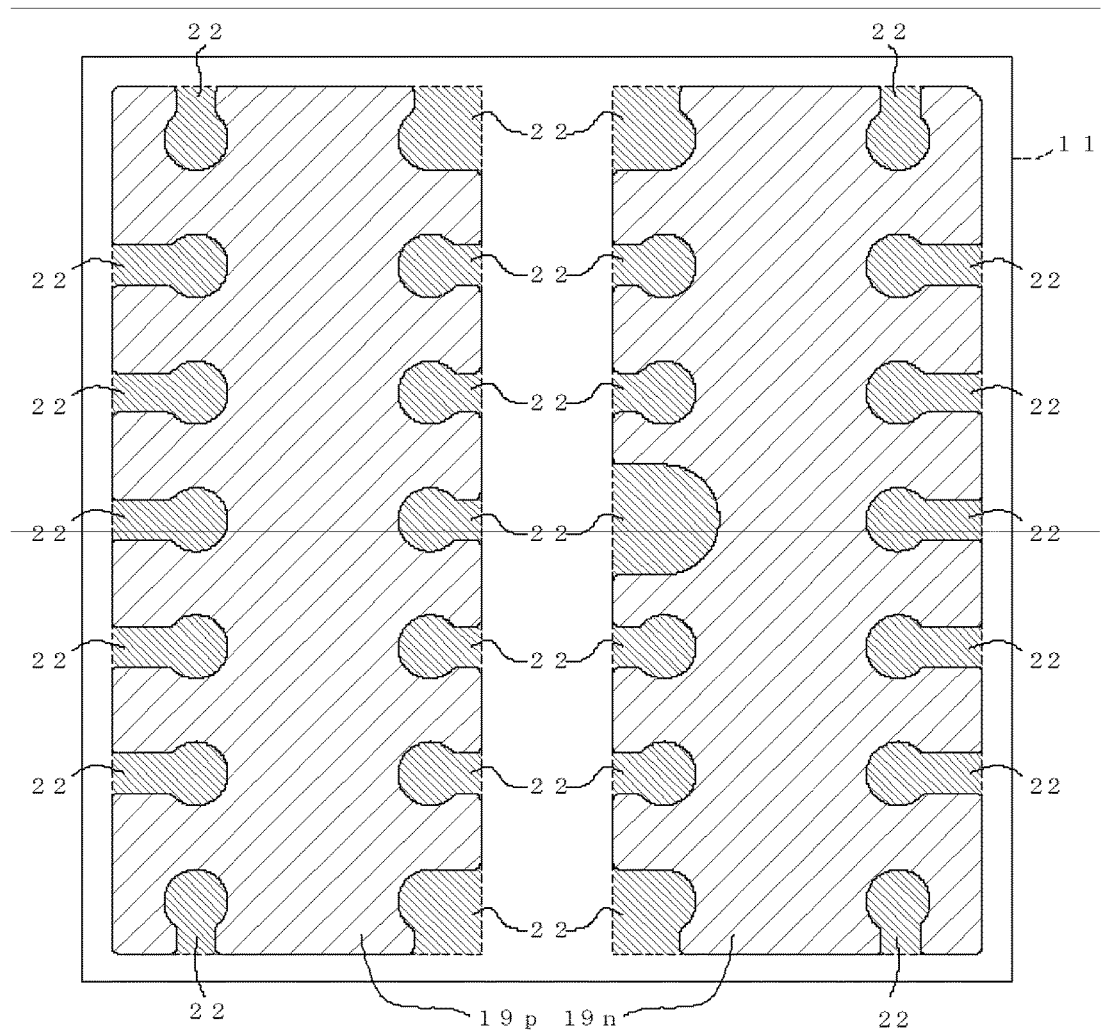
FIG. 4 is a plan view schematically showing the configuration of the light-emitting element according to Embodiment 1.
Figure 5:
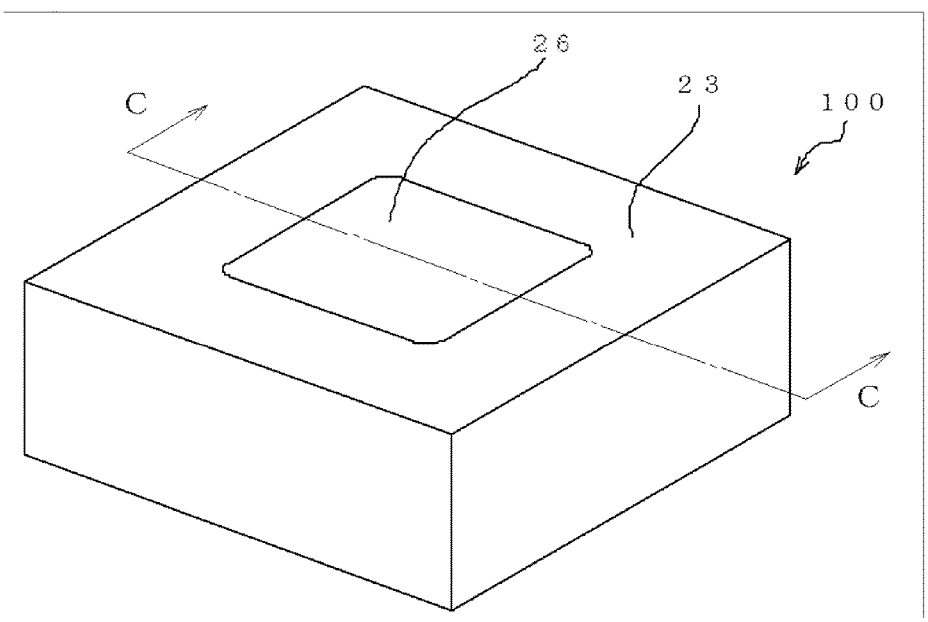
FIG. 5 is a perspective view schematically showing the configuration of the light-emitting device according to Embodiment 1.
Figure 6:
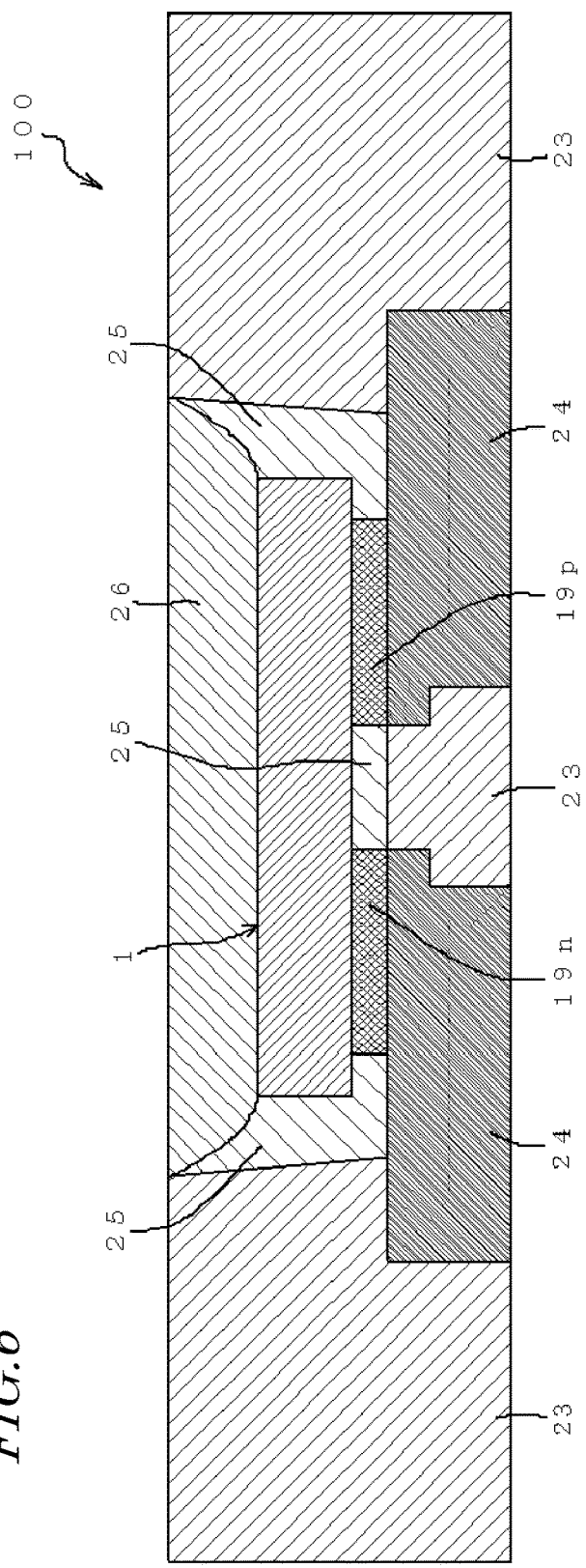
FIG. 6 is a cross-sectional view schematically showing the configuration of the light-emitting device according to Embodiment 1 taken along a line C-C of FIG. 5.

FIG. 1 is a diagram schematically showing a configuration of a light-emitting element 1A according to Embodiment 1 of the present disclosure. For the sake of reference, FIG. 1 shows x, y and z axes, which are perpendicular to one another. FIG. 2 is a schematic cross-sectional view of the light-emitting element 1A, showing a cross section taken along a line A-A of FIG. 1. FIG. 3 is a schematic cross-sectional view of the light-emitting element 1A, showing a cross section taken along a line B-B of FIG. 1. FIG. 4 shows a plan view illustrating regions where a first external connection portion 19n and a second external connection portion 19p of the light-emitting element 1A are disposed. FIG. 5 is a schematic perspective view showing a light-emitting device 100 in which the light-emitting element 1A is mounted on a base 23. FIG. 6 is a schematic cross-sectional view showing the light-emitting device 100 in which the light-emitting element 1A is mounted on the base 23 taken along a line C-C of FIG. 5.

Note that the figures referenced in the description below are intended to schematically illustrate embodiments of the present disclosure, and the scale, interval, positional relationship, etc., of components may be exaggerated, or a portion of a component may not be shown. Also, the scale and interval of components may not be the same between a plan view and its corresponding cross-sectional view. Moreover, in the description below, the same designation and the same reference numeral basically denote the same member or members made of the same material, and detailed description thereof may not be repeated.

As shown in FIGS. 1 to 3, the light-emitting element 1A includes: an insulating substrate 11; a plurality of semiconductor structures 12, each of which includes: an n-type semiconductor layer 12n disposed on an upper surface of the substrate 11, an active layer 12a disposed in a region of an upper surface of the n-type semiconductor layer 12n other than one or more predetermined regions thereof, and a p-type semiconductor layer 12p disposed on an upper surface of the active layer 12a; light-reflecting electrodes 13, each of which disposed on an upper surface of the p-type semiconductor layer 12p of a respective one of the plurality of semiconductor structures 12; a first insulating film 17 made of an inorganic material and covering the plurality of semiconductor structures 12, the first insulating film 17 having: one or more first n-side openings 17n, each of which located above a respective one of the one or more predetermined regions of the upper surface of the n-type semiconductor layer 12n of a respective one of the plurality of semiconductor structures 12 and one or more first p-side openings 17p, each of which located above a respective one of the light-reflecting electrodes 13; one or more interconnect electrodes 141 to 143 disposed on an upper surface of the first insulating film 17, each of the one or more interconnect electrodes connected to the n-type semiconductor layer 12n of one of corresponding two adjacent ones of the plurality of semiconductor structures 12 in a respective one of the first n-side openings 17n and connected to a respective one of the light-reflecting electrodes 13 of the other of the corresponding two adjacent ones of the semiconductor structures 12 through a respective one of the first p-side openings 17p; a first electrode 15 disposed on the upper surface of the first insulating film 17, and connected, in a respective one of the first n-side openings 17n, to the n-type semiconductor layer 12n of one of the plurality of semiconductor structures 12 on which a respective one of the light-reflecting electrodes 13 is connected to a respective one of the interconnect electrodes 141 to 143 (i.e., interconnect electrode 141); a second electrode 16 disposed on the upper surface of the first insulating film 17 and connected, in a respective one of the first p-side openings 17p, to the light-reflecting electrode 13 of one of the plurality of semiconductor structures 12 in which the n-type semiconductor layer 12n is connected to a respective one of the interconnect electrodes 141 to 143 (i.e., interconnect electrode 142); a second insulating film 18 made of an inorganic material, the second insulating film 18 having:

one or more second n-side openings 18n located above the first electrode 15, and one or more second p-side openings 18p located above the second electrode 16; a first external connection portion 19n disposed on an upper surface of the second insulating film 18 in a region other than the one or more predetermined regions of each of the semiconductor structures 12 when viewed from above, and connected to the first electrode 15 through each of the second n-side openings 18n; and a second external connection portion 19p disposed on the upper surface of the second insulating film 18 in a region other than the one or more predetermined regions of each of the semiconductor structures 12 in a top view, and connected to the second electrode 16 through each of the second p-side openings 18p.

With this configuration, thermal stress generated from the region of the n-type semiconductor layer 12n other than a predetermined region (i.e., a region where the active layer 12a is absent) and in the vicinity of the region, can be reduced. Thus, detachment of the first insulating film 17 and an electrode disposed in the first n-side opening 17n and connected to the n-type semiconductor layer 12n can be reduced. This will be described below in detail.

In the case in which an external connection portion is formed to cover a region of an n-type semiconductor layer on which an active layer is absent and a step portion is formed, thermal stress generated in the external connection portion at the time of mounting the light-emitting element on the base is likely to be concentrated in the region where the step portion is formed. It is believed that this is because in the external connection portion, a region where the step portion is formed includes a portion having a thickness smaller than the other region, and the thermal stress is likely to be applied upon the portion having smaller thickness. Due to thermal stress generated as described above in the external connection portion, thermal stress may also be generated in the region of the n-type semiconductor layer on which the active layer is absent. This may cause detachment of an insulating film and/or an interconnect electrode formed in that region from the semiconductor structure and migration of a material of an electrode disposed on the semiconductor structure to the region where the insulating film and/or the interconnect electrode is detached, which may lead to leak current and a decrease in reliability of the light-emitting element.

In view of this, as shown in FIG. 1, the first external connection portion 19n and the second external connection portion 19p are formed in the region of the upper surface of the n-type semiconductor layer 12n other than a predetermined region, i.e., in the region of the upper surface of the n-type semiconductor layer 12n other than a region where the active layer 12a and the p-type semiconductor layer 12p are absent. This allows for reducing influence of the thermal stress in the predetermined region of the upper surface of the n-type semiconductor layer 12n, and to reduce detachment of an electrode or an insulating film formed in the predetermined region, or the like. In the description below, the first external connection portion 19n and the second external connection portion 19p may be referred to collectively as an "external connection portion 19".

The light-emitting element 1A will be described below in detail.

As shown in FIG. 1, the light-emitting element 1A has a substantially square shape when viewed from above, and includes the insulating substrate 11, and a plurality of semiconductor structures 12 each including the n-type semiconductor layer 12n disposed on the upper surface of the substrate 11, the active layer 12a disposed in a predetermined region of the upper surface of the n-type semiconductor layer 12n, and the p-type semiconductor layer 12p disposed on the upper surface of the active layer 12a.

In the present embodiment, semiconductor structures 12 include four semiconductor structures, i.e., a first to fourth semiconductor structures 121 to 124. In the configuration illustrated in FIG. 1, each of the semiconductor structures 121 to 124 has a substantially rectangular shape elongated along the y direction and, and the semiconductor structures 121 to 124 are arranged along the x direction. Further, in the present embodiment, the semiconductor structures 121 to 124 are separated from each other by groove portions 12d, and each of the semiconductor structures 12 has an LED structure. The plurality of semiconductor structures 121 to 124 are connected together in series by the light-reflecting electrode 13 and the interconnect electrodes 141 to 143.

The first semiconductor structure 121, which is at one end of an array of the semiconductor structures 12 connected in series, is electrically connected to the second electrode 16, the second external connection portion 19p, and a respective one of the light-reflecting electrodes 13. The fourth semiconductor structure 124, which is at the other end of the array of the semiconductor structures 12 connected in series, is electrically connected to the first electrode 15 and the first external connection portion 19n.

The light-emitting element 1A has a configuration in which a power source is connected to the first external connection portion 19n, which is a cathode electrode, and the second external connection portion 19p, which is an anode electrode, to allow the first to fourth semiconductor structures 121 to 124 to emit light. The light-reflecting electrode 13 and the interconnect electrodes 141 to 143 are disposed at an upper surface side of the p-type semiconductor layer 12p. The light extraction surface is at a lower surface side of the light-emitting element 1A. The light-emitting element 1A has a structure suitable for flip chip mounting with the first external connection portion 19n and the second external connection portion 19p, which are disposed on the upper surface side.

Substrate

The substrate 11 is electrically insulating and supports the semiconductor structure 12 disposed thereon. The substrate 11 may be a growth substrate on which the semiconductor structure 12 is to be epitaxially grown. In the case in which a nitride semiconductor is used for the semiconductor structure 12, for example, the substrate 11 may be a sapphire ($Al_2O_3$) substrate. The substrate 11 may have a rectangular shape or a square shape in a plan view, for example. In the present embodiment, the substrate 11 has a substantially square shape. In the case in which the substrate 11 has a substantially square shape, the length of each side can be about 300 µm or greater and 3000 µm or less, preferably about 500 µm or greater and 1500 µm or less.

Semiconductor Structure

Each semiconductor structure 12 includes the n-type semiconductor layer 12n, the active layer 12a and the p-type semiconductor layer 12p layered in this order from the upper surface side of the substrate 11. The active layer 12a is disposed in a region of the upper surface of the n-type semiconductor layer 12n other than at least one predetermined region, and the p-type semiconductor layer 12p is disposed on the upper surface of the active layer 12a. In this example, the n-type semiconductor layer 12n has seven predetermined regions where the active layer 12a and the p-type semiconductor layer 12p are absent along the y direction. In other words, the active layer 12a and the p-type semiconductor layer 12p are not disposed on each of the plurality of predetermined regions of the upper surface of the n-type semiconductor layer 12n.

As shown in FIG. 1, the four semiconductor structures 12 (i.e., the first to fourth semiconductor structures 121 to 124 in this example) disposed on the upper surface of the substrate are separated from each other by three groove portions 12d that extend in the longitudinal direction of the four semiconductor structures 121 to 124 and that are parallel to each other. At the bottom surface of the groove portions 12d, the upper surface of the substrate 11 is exposed from the semiconductor structure 12. The first to fourth semiconductor structures 121 to 124 are connected to each other via the interconnect electrodes 141 to 143, but are electrically separated from each other.

Each of the first to fourth semiconductor structures 121 to 124 includes a region where the p-type semiconductor layer 12p and the active layer 12a are partially absent, i.e., a region of the n-type semiconductor layer 12n on which the active layer 12a and the p-type semiconductor layer 12p are not disposed (such a region will hereinafter be referred to as a "first exposed portion 12b"). Each of the first exposed portions 12b is located in a respective one of a plurality of predetermined regions of the upper surface of the n-type semiconductor layer 12n, and is a region depressed from the surface of the p-type semiconductor layer 12p to expose the n-type semiconductor layer 12n. In other words, each of the first exposed portions 12b is a region of a respective one of the semiconductor structures 12 where a step portion is formed by the upper surface of the p-type semiconductor layer 12p and the upper surface of the n-type semiconductor layer 12n. Each of the first to fourth semiconductor structures 121 to 124 includes seven first exposed portions 12b, each of which has a substantially circular shape in a top view.

In the first to fourth semiconductor structures 121 to 124, a second exposed portion 12c, which is a region where the n-type semiconductor layer 12n is exposed from the p-type semiconductor layer 12p and the active layer 12a, is disposed along the periphery of the substrate 11 in a region other than the groove portions 12d.

A nitride semiconductor such as $In_xAl_yGa_{1-x-y}N$ ($0 \leq X$, $0 \leq Y$, $X+Y<1$) is used for each of the n-type semiconductor layer 12n, the active layer 12a and the p-type semiconductor layer 12p.

Light-Reflecting Electrode

The light-reflecting electrode 13 functions as a current diffusion layer for diffusing the current supplied from the first electrode 15, the second electrode 16, and the interconnect electrodes 141 to 143, in order to flow current over a wide region of the p-type semiconductor layer 12p, and function also as a light-reflecting layer. The light-reflecting electrode 13 is disposed on substantially an entirety of the upper surface of the p-type semiconductor layer 12p of each of the first to fourth semiconductor structures 121 to 124.

The light-reflecting electrode 13 preferably includes a metal layer made of a metal material that has a good electrical conductivity and a good light-reflectance. Examples of such a metal material include, for example, Ag, Al, and an alloy whose main component is one of these metals.

In particular, Ag and an alloy thereof have high light-reflectances with respect to light emitted from the semiconductor structure 12 (e.g., visible light) is more preferably used, and thus is preferable. The light-reflecting electrode 13 may have a multilayered structure. For example, a light-reflecting layer for which a material having a good light-reflectance such as Ag or an alloy thereof is used may be disposed on the lower layer side, and a barrier layer for reducing the migration of a metal material used for the light-reflecting layer may be disposed at the upper layer side. The barrier layer is preferably disposed so as to cover the lower layer (e.g., light-reflecting electrode 13), and for example, SiN may be used for the barrier layer.

First Insulating Film

As shown in FIGS. 1 to 3, the first insulating film 17 continuously covers a portion of each of the first exposed portions 12b, the second exposed portion 12c, the groove portions 12d, lateral surfaces and the upper surface of each of the light-reflecting electrodes 13, and lateral surfaces of each of the first to fourth semiconductor structures 121 to 124. An end portion of the light-reflecting electrode 13 may have a curved surface in a cross-sectional view in an upper-lower direction of the light-reflecting electrode 13. In such a case, a surface of the light-reflecting electrode 13 substantially parallel to the upper surface of the p-type semiconductor layer 12p is the "upper surface of the light-reflecting electrode 13", and the curved surface of the end portion of the light-reflecting electrode 13 is the "lateral surface of the light-reflecting electrode 13".

In each of the plurality of semiconductor structures 12, the first insulating film 17 includes one or more first n-side openings 17n each having a substantially circular shape above the first exposed portion 12b, and one or more first p-side openings 17p above a respective one of the light-reflecting electrodes 13. In the present embodiment, a plurality of first n-side openings 17n are defined with respect to each of the seven first exposed portions 12b of each of the semiconductor structures 12.

The first insulating film 17 is made of an inorganic material. For example, an oxide or a nitride that contains at least one selected from the group consisting of Si, Ti, Zr, Nb, Ta, Al and Hf may be used for the first insulating film 17. Among these, $SiO_2$, which has a high transmittance with respect to visible light and a low reflective index, is preferably used. With the first insulating film 17 for which a material that has a reflective index lower than the semiconductor structure 12 or the substrate 11 and has a large reflective index difference with respect to the semiconductor structure 12 or the substrate 11 is used, light can be efficiently reflected at the interface between these members and the first insulating film 17. Increase in the light reflectance at the interface allows for reducing light leakage from the upper surface side of the light-emitting element 1A, i.e., from the side opposite to the light extraction surface.

Interconnect Electrode

As shown in FIGS. 1 to 3, each of the interconnect electrodes 141 to 143 is an interconnect disposed on the upper surface of the first insulating film 17 for electrically connecting at least two of the first to fourth semiconductor structures 121 to 124. Each of the interconnect electrodes 141 to 143 is connected to the n-type semiconductor layer 12n of one of corresponding two adjacent ones of the plurality of semiconductor structures 12 through the first n-side openings 17n, and is connected to the light-reflecting electrode 13 of the other one of the corresponding two adjacent ones semiconductor structures 12 through the first p-side openings 17p. Each of the interconnect electrodes 141 to 143 is electrically connected to the p-type semiconductor layer 12p of a respective one of the semiconductor structures 12, via a respective one of the light-reflecting electrodes 13, through the first p-side opening 17p located above the upper surface of the light-reflecting electrode 13.

The interconnect electrode 141 electrically connects the first semiconductor structure 121 and the second semiconductor structure 122 together. With the interconnect electrode 141, electrical interconnection is established between the n-type semiconductor layer 12n of the semiconductor structure 121 and the p-type semiconductor layer 12p of the semiconductor structure 122 via the light-reflecting electrode 13. Similarly, the interconnect electrode 142 electrically connects the second semiconductor structure 122 and the third semiconductor structure 123 together, and the interconnect electrode 143 electrically connects together the third semiconductor structure 123 and the fourth semiconductor structure 124 together. The interconnect electrodes 141 to 143 are arranged so as to continuously cover the upper surface, the lateral surfaces and a region therebetween of each of the first to fourth semiconductor structures 121 to 124.

In a light-emitting element having a structure in which as plurality of semiconductor structures are connected in series by the interconnect electrodes, as in the present embodiment, a potential difference is likely to be generated between the plurality of semiconductor structures, which may result in the migration of materials of the electrodes (e.g., a light-reflecting electrode or the interconnect electrodes). In the present embodiment, detachment of a portion of the first insulating film 17 at the first exposed portions 12b can be reduced, and thus migration of a material of the light-reflecting electrode 13 or the interconnect electrodes 141 to 143 can be reduced, so that generation of leak current can be reduced.

As shown in FIGS. 1 to 3, each of the interconnect electrodes 141 to 143 continuously cover, via the first insulating film 17, the lateral surfaces of respective ones of the first to fourth semiconductor structures 121 to 124, a respective one of the gaps between the first to fourth semiconductor structures 121 to 124, and an upper surface of a respective one of the light-reflecting electrodes 13. With the interconnect electrodes 141 to 143 as described above, a portion of each of the interconnect electrodes 141 to 143 overlaps a respective one of the light-reflecting electrodes 13 in a top view. Each of the interconnect electrodes 141 to 143 are disposed so as to cover at least a portion of each of the lateral surfaces of a respective one of the semiconductor structures 12, more preferably a portion of each of the lateral surfaces including the region where the active layer 12a is disposed, which allows for reducing the light leakage from the lateral surfaces of the semiconductor structures 12.

Each of the interconnect electrodes 141 to 143 preferably includes a metal layer made of a metal material having a good electrical conductivity and a good light-reflectivity. Examples of such a metal material include Ag, Al, and an alloy thereof. Al or an Al alloy is preferably employed for the interconnect electrodes 141 to 143 because they have a high light-reflecting property and less easily migrate compared with Ag.

First Electrode, Second Electrode

The first electrode 15 is disposed on the upper surface of the first insulating film 17, and is connected, through the first n-side opening 17n, to the n-type semiconductor layer 12n of one of the plurality of semiconductor structures 12 in which the interconnect electrode 141, 142 or 143 is connected to the light-reflecting electrode 13 but none of the interconnect electrodes 141 to 143 is connected to the n-type semiconductor layer 12n. The second electrode 16 is disposed on the upper surface of the first insulating film 17, and is connected, through the first p-side opening 17p, to the light-reflecting electrode 13 of another of the plurality of semiconductor structures 12 in which the interconnect electrode 141, 142 or 143 is connected to the n-type semiconductor layer 12n but none of the interconnect electrodes 141 to 143 is connected to the light-reflecting electrode 13. The second n-side opening 18n of the second insulating film 18 to be described below is located above the first electrode 15, and the second p-side opening 18p of the second insulating film 18 to be described below is located above the second electrode 16.

The first electrode 15 and the second electrode 16 preferably include a metal layer made of a metal material having a good electrical conductivity and a good light-reflectivity. Such a metal material may be a metal material similar to that used for the interconnect electrodes 141 to 143 described above.

Second Insulating Film

As shown in FIGS. 1 to 3, the second insulating film 18 continuously covers substantially the entirety of a surface of the first electrode 15, the second electrode 16, the interconnect electrodes 141 to 143 and the first insulating film 17. In this example, the second insulating film 18 is made of an inorganic material, and includes the second n-side openings 18n located above the first electrode 15 and the second p-side opening 18p located above the second electrode 16. In the present embodiment, the second insulating film 18 has six second p-side openings 18p and six second n-side openings 18n. The number and the shapes of second p-side openings 18p and second n-side openings 18n may be selected appropriately.

The second insulating film 18 also serves as a protection film for protecting the first electrode 15, the second electrode 16 and the interconnect electrodes 141 to 143. An inorganic material similar to that used for the first insulating film 17 described above is preferably used for the second insulating film 18. Different materials may be used for the first insulating film 17 and the second insulating film 18. With the second insulating film 18 made of an inorganic material, each of the first electrode 15, the second electrode 16 and the interconnect electrodes 141 to 143 can be electrically insulated from a respective one of the external connection portions 19 to be described below. The second insulating film 18 made of an inorganic material can be machined easily compared with a case where a resin, or the like, is used for the second insulating film 18. Meanwhile, an insulating film made of an inorganic material tends to be cracked due to a thermal stress applied thereon, compared with a case where an organic material such as a resin is used. On the other hand, in the present embodiment, thermal stress applied on the external connection portions 19 is unlikely to localize, and an occurrence of a crack or the like in the second insulating film 18 may be avoided.

First External Connection Portion, Second External Connection Portion

The first external connection portion 19n and the second external connection portion 19p are electrically connected to the first electrode 15 and the second electrode 16, respectively, and are disposed for external connection. As shown in FIGS. 1 to 3, the first external connection portion 19n is disposed on the upper surface of the second insulating film 18 in a region in a top view other than regions where the first exposed portions 12b are located, and the first external connection portion 19n is connected to the first electrode 15 through the second n-side opening 18n. The second external connection portion 19p is disposed on the upper surface of the second insulating film 18 in a region in a top view other than regions where the first exposed portions 12b are located, and the second external connection portion 19p is connected to the second electrode 16 through the second p-side opening 18p.

Each of the external connection portions 19n, 19p is disposed so as to extend over two or more semiconductor structures 12 in a top view, as shown in FIGS. 1 to 3. With this arrangement, when each of the external connection portions 19 is attached to a respective one of conductive portions 24 disposed on the base 23 to be described below, it is possible to increase the bonding area between each of the external connection portions 19 and the respective one of the conductive portions 24, so that bondability can be improved. Further, with first exposed portions 12b, each of which is disposed in a respective one of the plurality of semiconductor structures 12, and with the first electrode 15 and the interconnect electrodes 141 to 143 in the first n-side opening 17n, unevenness in current density distribution of the light-emitting element 1A can be reduced. In the present embodiment, thermal stress applied on the external connection portion 19 can be prevented from being concentrated at the first exposed portions 12b and its vicinity. Therefore, the area over which the external connection portion 19 is placed can be increased while reducing unevenness in current density distribution of the light-emitting element 1A, and bondability between each of the external connection portions 19 and a respective one of the conductive portions 24 can be efficiently improved.

In a top view, each of the external connection portions 19n, 19p includes a plurality of recesses 22 recessed inward from a periphery thereof, as shown in FIGS. 1 and 4. In FIG. 4, the first external connection portion 19n and the second external connection portion 19p are defined in regions indicated by a hatching with lower-left-to-upper-right lines, and the recesses 22 are formed in regions indicated by a hatching with lower-right-to-upper-left lines. In a plan view, each of the first exposed portions 12b are located in a respective one of a plurality of recesses 22 in a respective one of the first external connection portion 19n and the second external connection portion 19p. Thus, concentration of thermal stress at the first exposed portions 12b and in their vicinity can be avoided.

Conductive members such as solders are to be formed later in each of the external connection portions 19, and accordingly, it is preferable to increase an area of a portion of each of the external connection portions 19 to be a mounting surface, which is continuous in the X direction and the Y direction. Accordingly, the recesses 22 are preferably formed not near the center of each of the external connection portions 19n, 19p but along the periphery thereof. In the case in which the recesses 22 are formed in the periphery of each of the external connection portions 19, as an alternative to FIGS. 1 and 4, a configuration may be assumed to be employed in which the entire periphery of each recess 22 is surrounded by a respective one of the external connection portions 19. In this case, each of the external connection portions 19 includes a narrowed portion in a top view, thermal stress may be concentrated there, which may have influence on the members provided in the first exposed portions 12b. In view of this, in the present embodiment, even in the case in which the recesses 22 are formed near the periphery of each of the external connection portions 19, in a top view, each of the recesses 22 is open in the periphery of a respective one of the external connection portions 19 toward a predetermined direction so that the recesses 22 does not have narrow portions. In other words, each of the external connection portions 19 does not surround the entire periphery of each of the recesses 22, and, in a top view, each of the recesses 22 is recessed inward from the periphery of each of the external connection portions 19. Thus, each of the external connection portions 19 can be prevented from having relatively narrow portions, and therefore adverse influence of the thermal stress can be reduced. Note that the term "recess", as used in the present specification, refers to a portion that appears to have been cut out in a plan view, regardless of the method of formation thereof.

The first external connection portion 19n and the second external connection portion 19p preferably face each other, and in a plan view, in each of the first external connection portion 19n and the second external connection portion 19p, two of the recesses 22 are defined at opposite corners thereof such that the recesses 22 at opposite corners of the first external connection portion 19n face the recesses 22 at opposite corners of the second external connection portion 19p, as shown in FIGS. 1 and 4. That is, in the case in which the external connection portion has a substantially rectangular shape in a top view, the recesses 22 at the opposite corners of each of the first external connection portion 19n and the second external connection portion 19p are open both toward the central region located between the first external connection portion 19n and the second external connection portion 19p (hereinafter may be referred to also as the "central region") and toward an outer periphery side of the light-emitting element 1A. With such recesses 22, when a light-reflecting member 25 shown in FIG. 6 is poured in after the light-emitting element 1A is bonded to the conductive portions 24 on the base 23, the light-reflecting member 25 can be facilitated to enter the central region through the recesses 22 defined at the opposite corners of the first external connection portion 19n and the recesses 22 defined at the opposite corners of the second external connection portion 19p. As a result, the light-reflecting member 25 is disposed between the semiconductor structures 12 and the base 23, and can reflect light that unintendedly leaks from the light-emitting element 1A toward a base 23 side, so that the light extraction efficiency can be improved. Moreover, with the light-reflecting member 25 between the semiconductor structure 12 and the base 23, entry of moisture, etc., to the surface of the light-emitting element 1A can be reduced, and electrical connection between the first external connection portion 19n and the second external connection portion 19p can be reduced.

In the case in which the first external connection portion 19n and the second external connection portion 19p face each other, it is preferable that some of the recesses 22 are formed in one side of the first external connection portion 19n facing the second external connection portion 19p and others of the recesses 22 are defined in another side thereof facing away from the second external connection portion 19p. This can also be applied to the second external connection portion 19p.

As shown in FIGS. 1 and 4, a width of a region of the recess 22 where the first exposed portion 12b is located is larger than the width of the other region thereof. With this arrangement, compared with a case where the width of each of the recesses 22 is constant between the region where the first exposed portion 12b thereof is disposed and the periphery of a respective one of the first external connection portion 19n and the second external connection portion 19p, the area of the first external connection portion 19n and the area of the second external connection portion 19p can be increased, so that bondability between each of the first external connection portion 19n and the second external connection portion 19p and the base 23 can be increased.

As shown in FIGS. 1 and 4, the first external connection portion 19n and the second external connection portion 19p have substantially the same shape. With such a shape, it is possible to reduce concentration of the thermal stress generated at the time of mounting either toward the first external connection portion 19n or toward the second external connection portion 19p.

In the case in which the external connection portions 19 are formed by using a plating method, each of the external connection portions 19 may include the seed layer 20, which is a metal layer electrically connected to a respective one of the first electrode 15 and the second electrode 16, and a plating layer 21 deposited on the upper surface of the seed layer 20. The seed layer 20 is a metal layer that serves as the current path when the plating layer 21 is formed by using an electrolytic plating method, and can be formed by a sputtering method, a vapor deposition method, or the like.

The seed layer 20 preferably contains a metal layer made of a metal material having a good electrical conductivity and a good light-reflectivity. Examples of such metal materials include Al, Ag, an Al alloy and an Ag alloy. Moreover, the seed layer 20 is preferably a metal layer made of Al, Ag, an Al alloy or an Ag alloy disposed so as to be in contact with the second insulating film 18. With such a material, light traveling from the semiconductor structure 12 toward the base 23 side can be efficiently reflected toward the light extraction surface side of the light-emitting element 1A. Moreover, entry of moisture, etc., to the light-emitting element 1A can be reduced, and occurrence of leak can be reduced.

A metal such as Cu, Au or Ni may be used for the plating layer 21. The plating layer 21 may have a layered structure using a plurality of different metals. It is preferable that at least the uppermost layer of each of the external connection portions 19 is made of Au in order to prevent corrosion and to increase bondability with the base 23, for which an Au alloy-based bonding member such as an Au—Sn eutectic solder is used.

Base, Conductive Portion

The base 23 and the conductive portions 24 are integrally molded, and the light-emitting element 1A is bonded to and electrically connected to the conductive portion 24. In the present embodiment, as shown in FIG. 6, two conductive portions 24 are disposed in the base 23, and each of the first external connection portion 19n and the second external connection portion 19p is bonded to a respective one of the conductive portions 24, respectively. The light-emitting element 1A bonded to the base 23 can be used for the light-emitting device 100, and one side of each of the conductive portions 24 opposite to a side on which the light-emitting element 1A is bonded in FIG. 6 is mounted on a mounting substrate, or the like.

For the bonding between the external connection portion 19 and the conductive portion 24, a bonding member such as an Au—Sn-based solder or an Ag—Sn-based solder may be used, for example. When the light-emitting element 1A is bonded to the base 23 using such a bonding member, a heat treatment is required to be performed, which generates thermal stress on components of the light-emitting element 1A and the base 23. due to the influence of difference in temperature occurred during the heat treatment and the thermal expansion coefficient difference between the components of the light-emitting element 1A and the base 23.

A thermosetting resin or a thermoplastic resin may be used for the base 23. More specifically, an epoxy resin, a silicone resin, etc., may be used. The base 23 may contain a light-reflecting substance. A titanium oxide, a silicon oxide, a zirconium oxide, etc., may be used for the light-reflecting substance.

For example, Cu, which has good heat-radiating performance, or a metal material whose primary component is Cu may be used for the conductive portion 24. Such a metal material has a large thermal expansion coefficient, and therefore a large thermal stress may be generated with respect to the light-emitting element 1A. Therefore, in the first exposed portions 12b, the first insulating film 17, a portion of each of the interconnect electrodes 141 to 143 located in the first n-side openings 17n, the first electrode 15, the second electrode 16, or the like may be easily detached.

In the present embodiment, however, the thermal stress is not concentrated at the first exposed portions 12b and their vicinities.

Therefore, even in the case in which a metal material having a large thermal expansion coefficient such as Cu is used for the conductive portion 24, it is possible to improve the heat-radiating performance while maintaining reliability of the light-emitting element 1A. A metal layer may be formed on a surface of each of the conductive portions 24. For example, a metal layer made of a metal material such as Ag or Al may be formed on the outermost surface of each of the conductive portions 24.

Light-Reflecting Member

As shown in FIG. 6, the light-reflecting member 25 is disposed so as to cover a portion of the light-emitting element 1A other than the upper surface. The light-reflecting member 25 is disposed to reflect, toward the light extraction surface side of the light-emitting element 1A, light leaked toward the base 23. A material similar to that used for the base 23 described above is used for the light-reflecting member 25, and for example, a resin containing a light-reflecting substance may be used.

Sealing Member

A sealing member 26 may be disposed so as to cover the light extraction surface side of the light-emitting element 1A, as shown in FIG. 5. The sealing member 26 protects the light-emitting element 1A from external force, dust, moisture, etc., and also serves to improve the heat resistance, the weather resistance and the light resistance of the light-emitting element 1A. A material similar to that used for the base 23 described above may be preferably used for the sealing member 26.

While the light-emitting element 1A has been described above, the shape of the semiconductor structure 12 is not limited to be a rectangular shape, and it may be a polygonal shape such as a square shape or a hexagonal shape, a circular shape, an elliptical shape, or the like. The number of semiconductor structures 12 is not limited to four, and two or more semiconductor structures 12 may be employed. The semiconductor structures 12 are not limited to be arranged in an array in which all of the semiconductor structures 12 are connected in series. An array of the semiconductor structures 12 may include one or more sets of two or more semiconductor structures 12 connected in series, and may also include semiconductor structures 12 connected in parallel.

Second Embodiment

Figure 7:
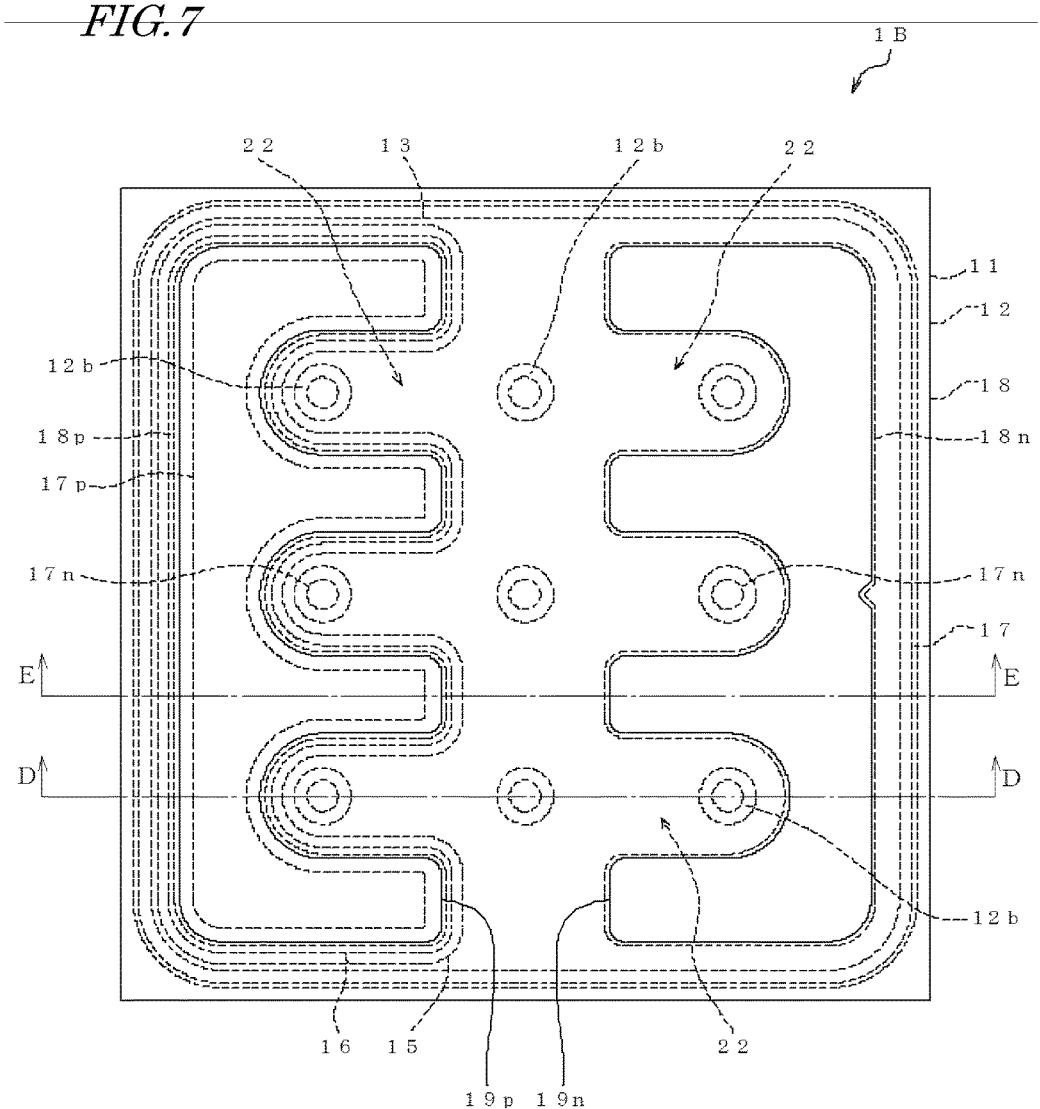
FIG. 7 is a plan view schematically showing a configuration of a light-emitting device according to Embodiment 2.
Figure 8:
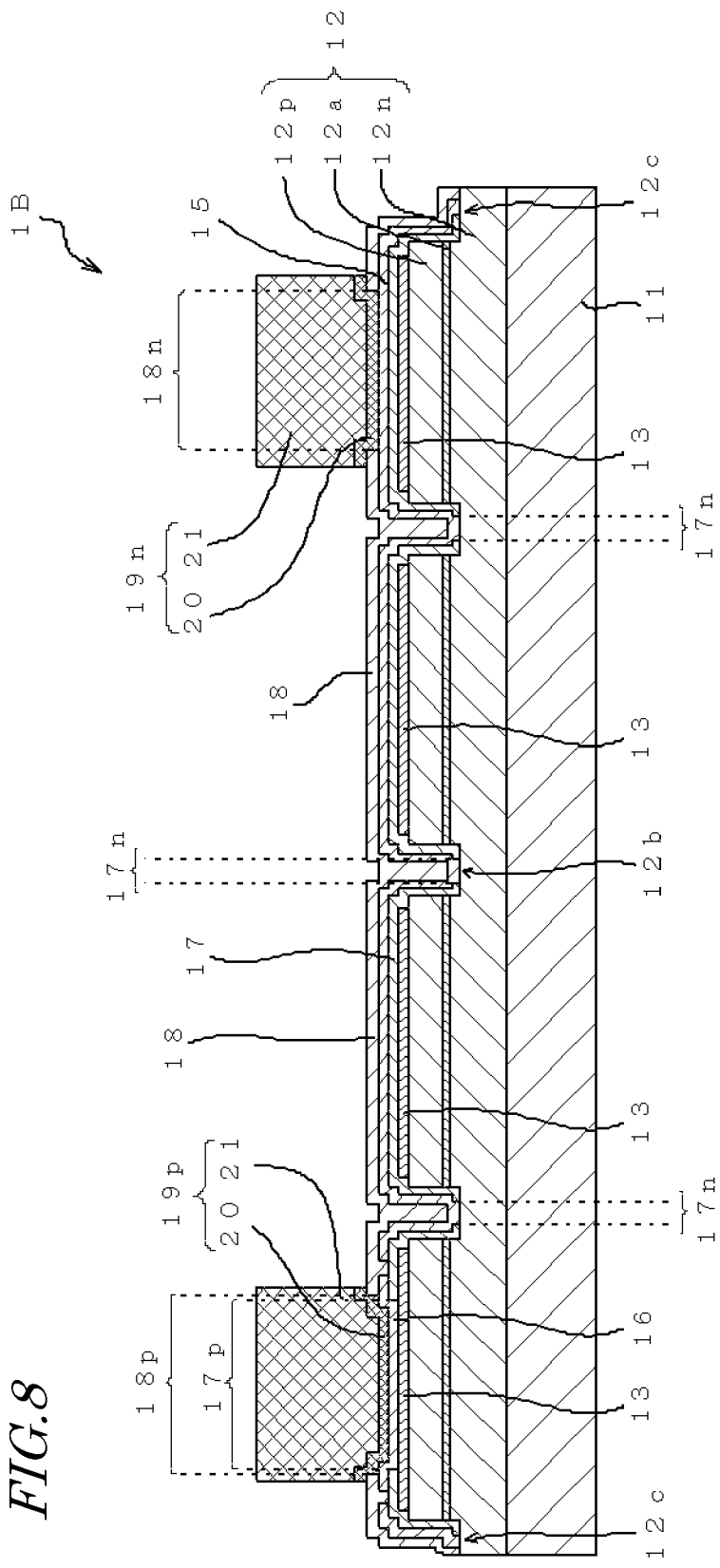
FIG. 8 is a cross-sectional view schematically showing the configuration of the light-emitting device according to Embodiment 2 taken along a line D-D of FIG. 7.
Figure 9:
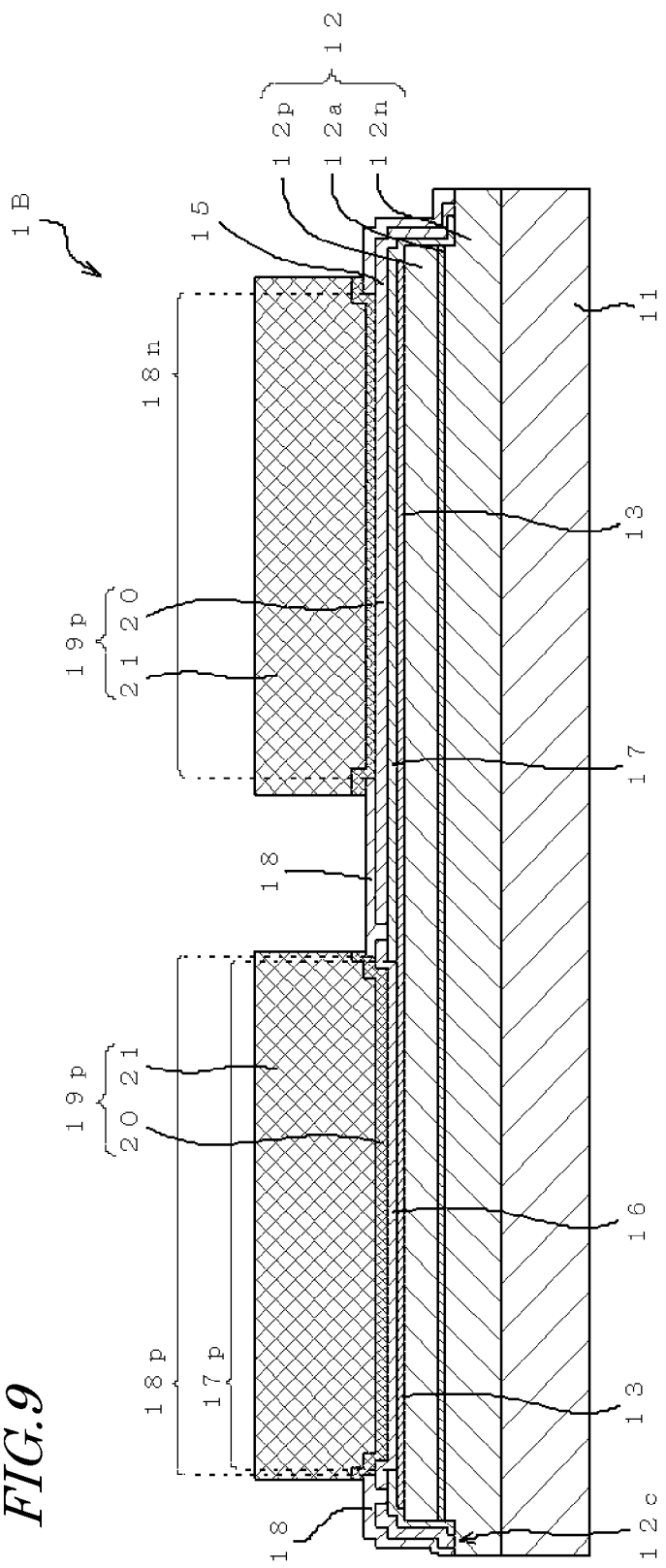
FIG. 9 is a cross-sectional view schematically showing the configuration of the light-emitting device according to Embodiment 2 taken along a line E-E of FIG. 7.

A light-emitting element 1B according to a second embodiment of the present disclosure will be described with reference to FIGS. 7 to 9. FIG. 7 is a schematic plan view showing an exemplary configuration of a light-emitting element 1B. FIG. 8 is a schematic cross-sectional view showing the configuration of the light-emitting element 1B taken along a line D-D of FIG. 7. FIG. 9 is a schematic cross-sectional view showing the configuration of the light-emitting element 1B taken along a line E-E of FIG. 7.

The light-emitting element 1B is different from the first embodiment mainly in that the light-emitting element 1B includes one semiconductor structure 12, and does not include the interconnect electrodes 141 to 143. Components corresponding to those in the first embodiment will hereinafter be denoted by the same reference numerals.

As shown in FIG. 7, in a top view, the light-emitting element 1B includes nine first exposed portions 12b arranged in three rows by three columns in one semiconductor structure 12. As shown in FIGS. 7 to 9, the first electrode 15 is connected to the n-type semiconductor layer 12n through each of the nine first exposed portions 12b, and the second electrode 16 is disposed on the light-reflecting electrode 13 and connected to the p-type semiconductor layer 12p.

Each of the external connection portions 19 is disposed in a region of the upper surface of the n-side semiconductor structure 12n other than a plurality of predetermined regions. These "predetermined regions" are regions where the first exposed portions 12b are disposed, i.e., where the active layer 12a and the p-type semiconductor layer 12p are absent. In this example, the first external connection portion 19n and the second external connection portion 19p respectively include three recesses 22, each of which is open toward the central region from a respective one of the first exposed portions 12b. The first external connection portion 19n and the second external connection portion 19p have substantially the same shape in a top view, and the plurality of recesses 22 has a shape that has substantially the constant width between the region where the first exposed portion 12b is disposed and the central region.

With the light-emitting element 1B, effects similar to those of the light-emitting element 1A can be obtained. Further, as in the light-emitting element 1A, the light-emitting element 1B can be bonded to the base 23 to be used as the light-emitting device 100.

Example

A light-emitting element according to an example of the present disclosure has a configuration as described below according to the light-emitting element 1A of the first embodiment.

A sapphire substrate having a substantially square shape with a side of about 1400 µm in a top view and having a thickness of about 150 µm was used for the substrate 11. Four (i.e., first to fourth) semiconductor structures 121 to 124, each of which is made of a nitride semiconductor and includes the n-type semiconductor layer 12n, the active layer 12a and the p-type semiconductor layer 12p layered in this order, were disposed on the upper surface of the substrate 11. Seven first exposed portions 12b each having a substantially circular shape with a diameter of about 30 µm in a top view was formed in each of the first to fourth semiconductor structures 121 to 124.

The light-reflecting electrodes 13 containing Ag were disposed on an upper surface of the p-type semiconductor layer 12p, and a barrier layer made of SiN was disposed so as to cover lateral surfaces and an upper surface of each of the light-reflecting electrodes 13. A metal containing Al was used for the first electrode 15, the second electrode 16 and the interconnect electrodes 141 to 143. An insulating film made of $SiO_2$ was used for the first insulating film 17 and the second insulating film 18.

A plating layer 21 of the external connection portion 19 was a metal layer containing Cu, and was disposed substantially at the same position as the position shown in FIG. 1 and has a thickness of about 50 µm. The external connection portions 19 as shown in FIG. 4 were formed using a mask. In a top view, each of the recesses 22 of the external connection portion 19 includes a circular region having a diameter of about 100 µm disposed so as to cover the first exposed portion 12b, and a region with a width of about 60 µm extending outward from the circular region toward an opening.

A light-emitting device in which a light-emitting element of the present example was used was produced. An epoxy resin was used for the base 23, and a metal containing Cu was used for the conductive portion 24. The light-emitting element of the present example was mounted on the conductive portions 24 using a solder.

Heat of about 120° C. was applied to a light-emitting device of the present example for a predetermined time, and reliability of the light-emitting device against humidity was evaluated. After applying heat for about 100 hours, electric leakage from the light-emitting element of the present example was not observed.

Comparative Example

A light-emitting element according to a comparative example has the same configuration as that of the present example except that the external connection portion was formed as below.

In the light-emitting element of the comparative example, each of external connection portions has a substantially rectangular shape in a top view in which no recesses 22 are formed. That is, each of the external connection portions was arranged so as to cover the first exposed portions 12b.

A light-emitting device was produced in a manner similar to the example as described above in which such a light-emitting element of the comparative example was used. The reliability of the light-emitting device was evaluated as in the present example. Leakage was observed after applying heat to the light-emitting device of the comparative example for about 60 hours.

The above disclosed subject matter should be considered illustrative, and not restrictive, and the appended claims are intended to cover all modifications, enhancements, and other embodiments that fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:
1. A light-emitting element comprising:
an insulating substrate;
a semiconductor structure comprising:
an n-type semiconductor layer disposed on an upper surface of the substrate,
an active layer disposed in a region of an upper surface of the n-type semiconductor layer other than one or more predetermined regions thereof, and
a p-type semiconductor layer disposed on an upper surface of the active layer;
a light-reflecting electrode disposed on an upper surface of the p-type semiconductor layer of the semiconductor structure;
a first insulating film made of an inorganic material and covering the plurality of semiconductor structures, the first insulating film having:
one or more first n-side openings, each of which is located above a respective one of the one or more predetermined regions of the upper surface of the n-type semiconductor layer of the semiconductor structure, and
one or more first p-side openings, each of which is located above the light-reflecting electrode;
a first electrode disposed on the upper surface of the first insulating film and connected, through a respective one of the one or more first n-side opening, to the n-type semiconductor layer of the semiconductor structure;

a second electrode disposed on the upper surface of the first insulating film and connected, through a respective one of the one or more first p-side openings, to the light-reflecting electrode;

a second insulating film made of an inorganic material, the second insulating film having:
one or more second n-side openings located above the first electrode, and
one or more second p-side openings located above the second electrode;

a first external connection portion disposed on an upper surface of the second insulating film in a region other than the one or more predetermined regions of the semiconductor structure in a top view, and connected to the first electrode through each of the one or more second n-side openings; and a second external connection portion disposed on the upper surface of the second insulating film in a region other than the one or more predetermined regions of the semiconductor structure in a top view, and connected to the second electrode through each of the one or more second p-side openings.

2. The light-emitting element according to claim 1, wherein:
in a top view:
each of the first external connection portion and the second external connection portion includes a plurality of recesses recessed inward from a periphery thereof; and
each of the one or more predetermined regions is located in a corresponding one of the plurality of recesses of each of the first external connection portion and the second external connection portion.

3. The light-emitting element according to claim 2, wherein:
in a top view:
the first external connection portion and the second external connection portion face each other; and
the plurality of recesses include two recesses formed at opposite corners of the first external connection portion and two recesses formed at opposite corners of the second external connection portion, the two recesses at the opposite corners of the first external connection portion face the two recesses at the opposite corners of the second external connection portion.

4. The light-emitting element according to claim 1, wherein the first insulating film and the second insulating film are made of $SiO_2$.

5. The light-emitting element according to claim 1, wherein the light-reflecting electrode is made of Ag, Al, or an alloy thereof.

6. A light-emitting element comprising:
an insulating substrate;
a plurality of semiconductor structures, each of which comprises:
an n-type semiconductor layer disposed on an upper surface of the substrate,
an active layer disposed in a region of an upper surface of the n-type semiconductor layer other than one or more predetermined regions thereof, and
a p-type semiconductor layer disposed on an upper surface of the active layer;
a plurality of light-reflecting electrodes, each of which is disposed on an upper surface of the p-type semiconductor layer of a respective one of the plurality of semiconductor structures;

a first insulating film made of an inorganic material and covering the plurality of semiconductor structures, the first insulating film having:
one or more first n-side openings, each of which is located above a respective one of the one or more predetermined regions of the upper surface of the n-type semiconductor layer of a respective one of the plurality of semiconductor structures, and
one or more first p-side openings, each of which is located above a respective one of the light-reflecting electrodes;

one or more interconnect electrodes disposed on an upper surface of the first insulating film, each of the one or more interconnect electrodes connected to the n-type semiconductor layer of a first of two adjacent ones of the plurality of semiconductor structures through a respective one of the one or more first n-side openings, and connected to a respective one of the light-reflecting electrodes of a second of the two adjacent ones of the semiconductor structures through a respective one of the one or more first p-side openings;

a first electrode disposed on the upper surface of the first insulating film and connected, through a respective one of the one or more first n-side openings, to the n-type semiconductor layer of one of the plurality of semiconductor structures on which a respective one of the light-reflecting electrodes is connected to a respective one of the interconnect electrodes;

a second electrode disposed on the upper surface of the first insulating film and connected, through a respective one of the one or more first p-side openings, to the light-reflecting electrode of one of the plurality of semiconductor structures in which the n-type semiconductor layer is connected to a respective one of the interconnect electrodes;

a second insulating film made of an inorganic material, the second insulating film having:
one or more second n-side openings located above the first electrode, and
one or more second p-side openings located above the second electrode;

a first external connection portion disposed on an upper surface of the second insulating film in a region other than the one or more predetermined regions of each of the semiconductor structures in a top view, and connected to the first electrode through each of the one or more second n-side openings; and a second external connection portion disposed on the upper surface of the second insulating film in a region other than the one or more predetermined regions of each of the semiconductor structures in a top view, and connected to the second electrode through each of the one or more second p-side openings.

7. The light-emitting element according to claim 6, wherein each of the first external connection portion and the second external connection portion are disposed so as to extend over two or more of the semiconductor structures.

8. The light-emitting element according to claim 7, wherein:
in a top view:
each of the first external connection portion and the second external connection portion includes a plurality of recesses recessed inward from a periphery thereof; and
each of the one or more predetermined regions is located in a corresponding one of the plurality of recesses of each of the first external connection portion and the second external connection portion.

9. The light-emitting element according to claim 8, wherein:
in a top view:
the first external connection portion and the second external connection portion face each other; and
the plurality of recesses include two recesses formed at opposite corners of the first external connection portion and two recesses formed at opposite corners of the second external connection portion, the two recesses at the opposite corners of the first external connection portion face the two recesses at the opposite corners of the second external connection portion.

10. The light-emitting element according to claim 7, wherein the first insulating film and the second insulating film are made of $SiO_2$.

11. The light-emitting element according to claim 6, wherein:
in a top view:
each of the first external connection portion and the second external connection portion includes a plurality of recesses recessed inward from a periphery thereof; and
each of the one or more predetermined regions is located in a corresponding one of the plurality of recesses of each of the first external connection portion and the second external connection portion.

12. The light-emitting element according to claim 11, wherein:
in a top view:
the first external connection portion and the second external connection portion face each other; and
the plurality of recesses include two recesses formed at opposite corners of the first external connection portion and two recesses formed at opposite corners of the second external connection portion, the two recesses at the opposite corners of the first external connection portion face the two recesses at the opposite corners of the second external connection portion.

13. The light-emitting element according to claim 12, wherein the first insulating film and the second insulating film are made of $SiO_2$.

14. The light-emitting element according to claim 6, wherein the first insulating film and the second insulating film are made of $SiO_2$.

15. The light-emitting element according to claim 6, wherein the interconnect electrode is made of Ag, Al, or an alloy thereof.

16. The light-emitting element according to claim 6, wherein the light-reflecting electrode is made of Ag, Al, or an alloy thereof.

* * * * *